United States Patent [19]

Nakayama

[11] 4,322,810
[45] Mar. 30, 1982

[54] DIGITAL FILTERS WITH REDUCED MULTIPLIER CIRCUITRY

[75] Inventor: Kenji Nakayama, Tokyo, Japan

[73] Assignee: Nippon Electric Co., Ltd., Tokyo, Japan

[21] Appl. No.: 148,092

[22] Filed: May 9, 1980

[30] Foreign Application Priority Data

May 16, 1979 [JP] Japan .................................. 54-59895

[51] Int. Cl.³ ............................................ G06F 15/31
[52] U.S. Cl. .................................................. 364/724
[58] Field of Search ......................................... 364/724

[56] References Cited

U.S. PATENT DOCUMENTS

| | | | |
|---|---|---|---|
| 3,777,130 | 12/1973 | Croisier et al. | 364/724 |
| 3,988,606 | 10/1976 | Eggermont | 364/724 |
| 4,125,900 | 11/1978 | Betts | 364/724 |
| 4,255,794 | 3/1981 | Nakayama | 364/724 |

OTHER PUBLICATIONS

Tubiana, "Digital Filter", *IBM Tech. Disclosure Bulletin*, vol. 17, No. 9, Feb. 1975, pp. 2656–2658.

*Primary Examiner*—David H. Malzahn
*Attorney, Agent, or Firm*—Townsend and Townsend

[57] ABSTRACT

A digital filter comprises a circuit means for applying a plurality of binary coded weights to a binary coded input data. The circuit means is constructed such that any of integer amounting to the number of bits of the binary coded weight data or to the number of partial bits divided from the weight data is multiplied by the binary coded input data and a result of the multiplication is stored in a memory device in an address thereof corresponding to the integer, that the memory device is accessed by an address of the weight data or the partial bit, and that the digit of the data read out of the memory device is shifted and accumulated to produce a product of the input data and weight data. A product regarding a preceding input data and that regarding a succeeding input data are added together to produce a filter output.

2 Claims, 6 Drawing Figures

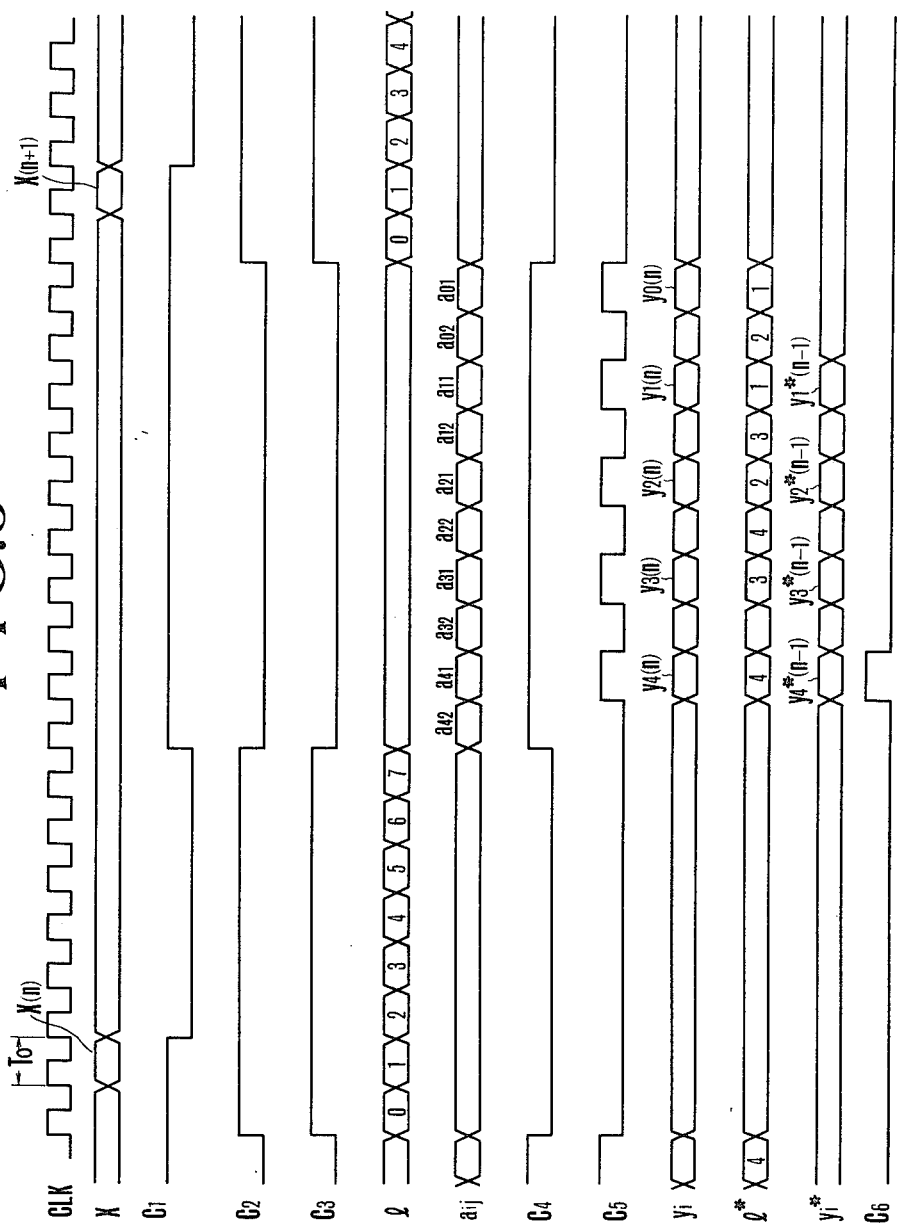

DIGITAL FILTERS WITH REDUCED MULTIPLIER CIRCUITRY

BACKGROUND OF THE INVENTION

This invention generally relates to a digital filter, and more particularly to a digital filter which sequentially delays a binary coded input for producing an output accruing from weighting and adding of the input delayed.

In a digital filter, an output at a given time is determined according to a past output and a weighted sum of the past and present inputs. In principle, such a digital filter comprises a plurality of multipliers for applying a plurality of weights to the input signal, a delay circuit for delaying the outputs of respective multipliers, and an adder which adds together the output of a multiplier of a succeeding stage and the output of a multiplier of a preceding stage. However, in a digital filter of high order, it is necessary to provide a multiplier, a delay circuit and an adder for each weighting stage, thus requiring a large number of such circuit elements. Particularly, provision of a plurality of stages of such complicated circuits as the multipliers increases the number of the arithmetic operations, thus increasing the size of the filter.

One approach to the solution to this problem is disclosed in U.S. Pat. No. 3,777,130 to Croisier et al entitled "Digital Filter for PCM Encoded Signals". The invention of this application also contemplates an approach to a similar problem and improves Croisier et al in that the memory capacity is reduced and the application to adaptive filters is facilitated.

SUMMARY OF THE INVENTION

Accordingly, it is an object of this invention to provide an improved digital filter which is suitable for multiplying the input data by a plurality of weight data through a small number of arithmetic operations and hence which is small in size, and capable of readily changing the input data.

According to this invention, there is provided a digital filter in which the relation between an input data signal x(n) and an output data signal Y(n) is given by the relationship:

$$Y(n) = \sum_{i=0}^{N-1} a_{n-i} x(n - i)$$

where n is an integer and $a_{n-i}$ is a multiplier. The filter includes a multiplier unit having first means for multiplying the input data x(n) by all the integers l ranging from 0 to $2^M - 1$, where M is the bit number of either a binary coded weight data $a_i$ or its partial bit $a_{ij}$ (j = 1, 2, ..., K); a first storage means for storing an output l x(n) of the first means in an address of l; a selector circuit for selecting the integer l and either the weight data $a_i$ or its partial bit $a_{ij}$ and supplying the selection result to the first storage as an address signal; second means for reading outputs from the first storage by an address signal of the weight data $a_i$ or its K partial bits $a_{ij}$ in the sequence i = N − 1, N − 2, ..., 0, accumulating and thereafter shifting the outputs to the lower order by the bit number of the address signal, and multiplying the resulting outputs by the sign of $a_i$ to produce $a_i x(n)$; third means including a second storage which is adapted to read a data stored in an address corresponding to i, add the read data and the output $a_i x(n)$, (i = N − 2, N − 3, ..., 0) of the second means, and storing the sum in an address corresponding to i + 1; and fourth means for adding an output $a_{N-1} x(n)$ corresponding to i = N − 1 of the second means and a data stored in an address corresponding to N − 1 of the second storage to produce a filter output.

The first means can alternately be replaced by means which accumulates the input data x(n) sequentially in accordance with the following equation:

$$x(n) = (l-1) \cdot x(n) + x(n), \quad 1 \leq l \leq 2^M - 1$$

to produce the entire l x(n), (l = 0, 1, ..., $2^M - 1$).

BRIEF DESCRIPTION OF THE DRAWINGS

In the accompanying drawings:

FIG. 6 is a time chart useful to explain the operations of the circuits shown in FIGS. 3 and 5.

DESCRIPTION OF THE PREFERRED EMBODIMENTS

Figure 1:
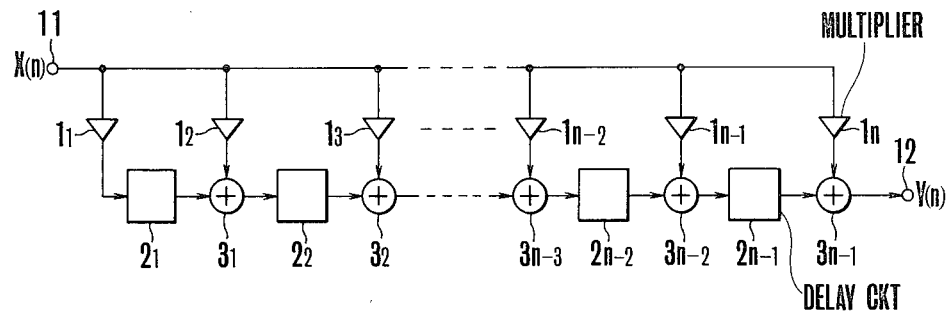
FIG. 1 is a diagrammatic representation of a circuit construction showing the principle of a digital filter.

Referring now to FIG. 1, in a digital filter diagrammatically illustrated in FIG. 1, an input signal X(n) supplied to an input terminal 11 is sequentially multiplied by a plurality of multipliers $a_1$ to $a_n$ at n (an integer) multipliers $1_1$ to $1_n$ and the output of the multiplier $1_1$ is delayed by a sampling period T (equal to an interval between X(n) and X(n+1) shown in FIG. 6) with respect to the input signal X(n) by a delay circuit $2_1$ and then added together with the output of the multiplier $1_2$ by an adder $3_1$. The output of the adder $3_1$ is delayed by the interval T by a delay circuit $2_2$ and then added to the output of a multiplier $1_3$ by an adder $3_2$. In the same manner, the added outputs are sequentially delayed by the period T and added together with the outputs of the succeeding multipliers, and the output of the adder $3_{n-1}$ of the last stage is applied to an output terminal 12 as a filtered output.

Figure 2:
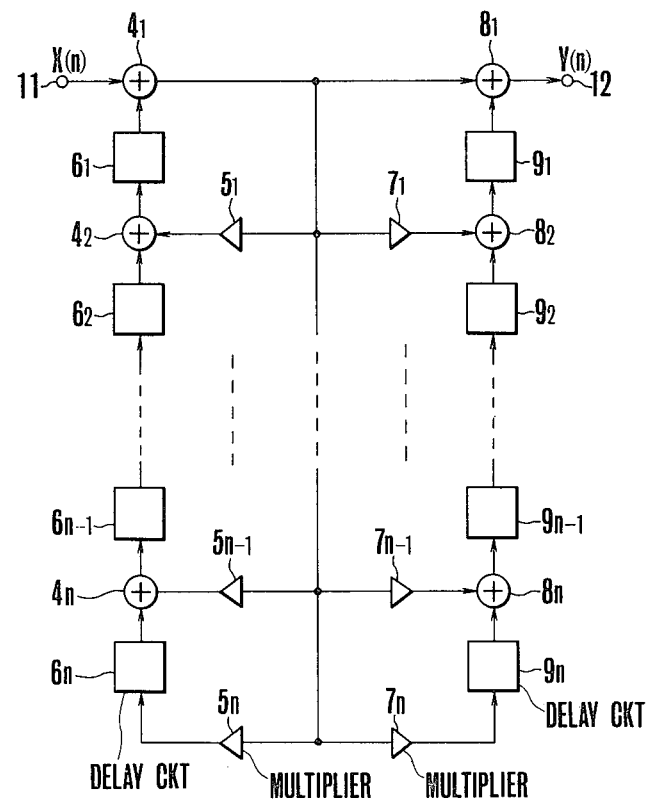
FIG. 2 is similar diagrammatic representation showing another basic construction of a digital filter.

FIG. 2 is a diagrammatical representation of a so-called recursive type digital filter, in which an input signal X(n) applied to the input terminal 11 is added together with the output of a delay circuit $6_1$ by an adder $4_1$, and the output of the adder $4_1$ is multiplied by multipliers $b_1$ to $b_n$ respectively by n multipliers $5_1$ to $5_n$, and also multiplied with respective constants $C_1$ to $C_n$ by multipliers $7_1$ to $7_n$. The output of the adder $4_1$ is also coupled to an adder $8_1$. The outputs of respective multipliers $5_1$ to $5_{n-1}$ are applied to respective adders $4_2$ to $4_n$ and the outputs thereof are applied to adders $4_1$ to $4_{n-1}$ respectively through delay circuits $6_1$ to $6_{n-1}$ each having a delay time corresponding to the period T. The output of the multiplier $5_n$ is supplied to the adder $4_n$ via delay circuit $6_n$. The outputs of multipliers $7_1$ to $7_{n-1}$ are supplied to adders $8_2$ to $8_n$ respectively and the outputs thereof are supplied to adders $8_1$ to $8_{n-1}$ respectively through delay circuits $9_1$ to $9_{n-1}$. The output of the multiplier $7_n$ is applied to the adder $8_n$ via a delay circuit $9_n$ and the output of the adder $8_1$ is applied to an output terminal 12 as a filtered output.

With a digital filter as shown in FIG. 1 the same input X(n) is multiplied n times by the multipliers $1_1$ to $1_n$, whereas with the digital filter as shown in FIG. 2, the same output of the adder $4_1$ is multiplied 2n times by the multipliers $5_1$ to $5_n$ and $7_1$ to $7_n$. Assuming that the number of bits of each multiplier $a_i$ is equal to p, for example, during the multiplying operations, an addition operation of a multiplier is executed (p−1) times so that with n multipliers, addition operations are performed n(p−1) times, thus greatly increasing the total number of the addition operations. Furthermore the digital filter shown in FIG. 1 requires n multipliers, whereas the digital filter shown in FIG. 2 requires 2n multipliers, so that the circuit construction of the multipliers becomes complicated. In this manner, an increase in the number of the multipliers increases the size of the filter circuit.

The invention contemplates a decrease in the number of the multipliers necessary to execute multiplying operations in which the same input X is multiplied by respective multipliers ai in order to obtain the outputs of the digital filter of the type described above, and the present invention is based on the following principle.

Consider multiplication of the same data X by a multiplier of coefficient ai (i=0, 1, 2 ... N−1), that is, computation of the following equation (1)

$$y_i = a_i X \tag{1}$$

When it it assumed that $a_i$ consists of K×M bits except for the sign bit, that its most significant bit is Mo, and that the sign bit is $a_{is}$, by dividing the multiplier $a_i$ into K partial bits of M bits as shown by the following equation $$a_i = 2^{Mo} \sum_{j=1}^{K} a_{is} a_{ij} 2^{-jM}, \tag{2}$$

the data X is multiplied by the partial bits according to the following equation $$y_i = a_{is} \sum_{j=1}^{K} (a_{ij} X) 2^{Mo - jM} \tag{3}$$

Since in equation (3) the number $a_{ij}$ which the multipliers can take is only $2^M$ (that is 0, 1 ... $2^M - 1$), $a_{ij}X$ can be obtained by previously calculating Xl (l=0, 1 ... $2^M - 1$) for the input X, then storing the calculated Xl in an address l of a memory device, and by reading independently the stored Xl using an address of $a_{ij}$.

The calculated Xl can be used in common for all $a_{ij}$ (where i=0, 1 ... N−1, and j=1, 2 ... K) and the Xl can be obtained by repeatedly calculating the equation $$Xl = X(l-1) + X \tag{4}$$

for l=1,2 ... $2^M - 1$ without performing a multiplying operation. Thus, the operation for obtaining $a_i$ X involves reading out of $a_{ij}X$, shifting the read out data bits by Mo−jM and multiplying with $a_{is}$.

One example of the construction of a multiplier (wherein N−1=4) utilizing such an algorithm will now be described with reference to FIG. 3. As shown, a read/write memory device, i.e., a RAM 14 is provided which can be accessed by an address signal l(l=0, 1, ... $2^M - 1$) generated by an address generator 15 comprising a ROM and supplied through a contact 1 of a switch 16. The memory device 14 can also be accessed by data generated by a data generator 17 comprising a ROM through contact 2 of the switch 16. Input data X(n) supplied to an input terminal 11 is multiplied by a multiplier 19 so that digit of the input data is shifted by Mo-M, and supplied via a contact 1 of a switch 23 to a multiplier section 21a, the output thereof being applied to the memory device 14 as write data via a switch 22. The multiplier section 21a multiplies the input data X(n) by any integer that can be expressed by M bits according to equation (4), in this example. The switch 23 is thrown between contact 1 on the output side of the multiplier 19 and a contact 2 on the output side of a delay circuit 24 having a delay time of $T_0$ (equal to a clock period as shown in FIG. 6). One input of an adder 26 is connected to the contact 2 of the switch 23 and the input of the delay circuit 24, while the output of the adder 26 is connected to the other input thereof through a delay circuit 28 having a delay time of $T_0$.

When the contact 1 of the switch 16 and the switch 22 are both closed and when the address generator 15 produces an address signal l="1", the input data X(n) is multiplied by $2^{Mo-M}$ at the multiplier 19 and this product $X'(n) = (n)2^{Mo-M} X'$ is applied to the adder 26 via contact 1 of switch 23 to be stored in the address l="1" of the memory device 14 via switch 22.

At the next step, the switch 23 is thrown to the contact 2 connected to the delay circuit 24 whereby the outputs of both delay circuits 24 and 28 are added together with the result that the sum 2X' (n) is stored in the address "2" of the memory device 14. The operation described above is repeated until an address l=$2^M - 1$ is reached.

When the writing into the memory device 14 is completed in this manner, partial bit pattern $a_{ij}$ of the weight data $a_i$ to be multiplied is generated by the data generator 17 in the order of j=K, K−1, K−2 ... 1, that is, starting with the least significant bit. Such partial bits are used as addresses to access the memory device 14. At this time, the contact 1 of switch 16 and the switch 22 are opened and the contact 2 of switch 16 is closed. The product of the read out data X(n) and the partial bit i.e., a partial product is applied to an adder 32 of a multiplier section 21b. The output of the adder 32 is shifted by the number of bits of the partial bit and then accumulated or added with a partial product read out during the next period. In other words, the output of the adder 32 is applied to a delay circuit 33 having a delay time of $T_0$ via the contact 2 of a switch 35 and the output of the delay circuit 33 is multiplied by $2^{-M}$ at a multiplier 34 to provide a shift by −M digits and this result is then supplied to the adder 32. Thus, the multiplier 34 is required to shift only by M digits the output of the delay circuit 33.

A partial bit pattern $a_{ij}$ is sequentially generated starting from its least significant bit for reading out a corresponding partial product which is shifted to a lower digit order by a number of bits of the partial bit and added to a partial product read out during the next time period. This operation is repeated. A j=1 of the partial bit $a_{ij}$ is applied to the memory device 14 to read out a corresponding partial product which is accumulated by the adder 32 so that it produces an output $|a_i|X(n)$.

Concurrently therewith switch 35 is thrown to contact 1 and its output is multiplied by the sign bit $a_{is}$ of $a_i$ at a multiplier 36 which gives its outputs $y_i(n)$ to an output terminal 37.

By repeatedly reading out the memory device 14 with respect to respective data $a_j$ (i=0 to 4), an output $y_i(n)$ (i=0 to 4) can be obtained.

The timings of respective signals are shown in a timing chart shown in FIG. 6. Where the control signals applied to switches 16, 22 and 35 and 2 inputs-one output and one input-2 outputs, these switches are thrown to their contacts 1 when Ci="1" (i=1 to 5) and are thrown to their contacts 2 when Ci="0", but in the case of one input-one output these switches are closed when Ci="1" and opened when Ci="0".

The terminal $\overline{WE}$ becomes a read out mode when Ci="1" so that the contents can be read out when an address signal is inputted, whereas when Ci is "0" the terminal $\overline{WE}$ becomes a write mode so that upon application of an address signal and data, the data can be written in.

Where the number of the coefficient $a_j$ is 100, the word length of the coefficient $a_j$ is 13 bits (including a sign) and the number of the partial bits M is equal to 4 bits, the number of the addition operations at the multiplier section 21a for writing into the memory 14 becomes $2^M=2^4=16$. The number of the addition operations of the adder 32 at the time of reading out the memory device 14 becomes a product $3 \times 100=300$ of the number 3 of the divided partial bits and the number n of the coefficients $a_j$. Accordingly, it is necessary to perform a total of $16+300=316$ addition operations.

In contrast, with the prior art construction shown in FIG. 1, one multiplying operation of X(n) and the coefficient $a_i$ of 13 bits is performed by 12 addition operations, and since $a_j$ is 100, the total number of the addition operations is $12 \times 100 = 1200$. Comparison of this value with 316 of this invention shows that the scale of the arithmetic operation of this invention is reduced by about $\frac{1}{4}$.

Moreover, where the value n of the coefficient $a_i$ is large and when it is divided into partial bits there are a plurality of sets having the same value among the entire partial bits. In this case, the scale of the arithmetic operation can be reduced greatly in accordance with the invention. After writing and reading into and out of the memory device 14 one sample input data X(n), a similar operation is repeated for the next input data X(n+1). If possible, the address generator 15 and the coefficient generator 17 may be combined into one unit. Operations described above can be performed by executing a program with a microcomputer, in which case a portion of a random access memory may be used as delay circuits 24, 28 and 33.

Figure 4:
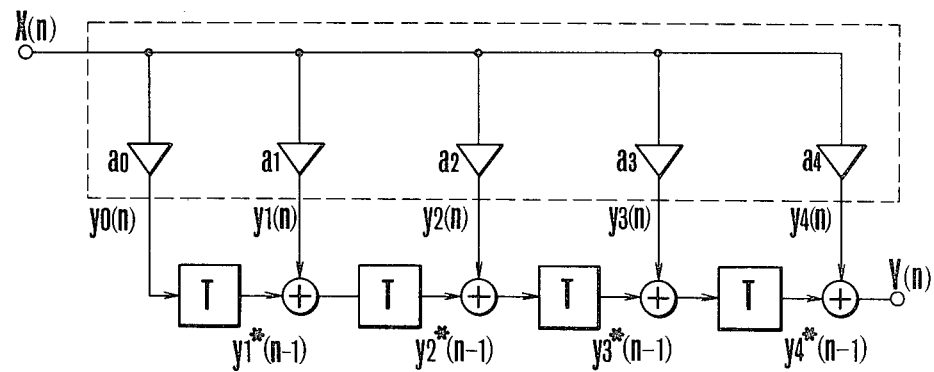
FIG. 4 is a diagrammatic connection diagram showing input and output signals, a weighting signal and a delayed output of a weighting circuit for a digital filter.

The digital filter shown in FIG. 1 and having the number of order 4 is shown in FIG. 4 in which $a_i$ (i=0 to 4) represents a multiplier for the respective multipliers, $Y_i(n)$ represents the output of each multiplier at a time n, X(n) represents an input signal at the time n, and $Y_i^*(n-1)$ represents the output of each delay circuit at the time, Y(n) represents the output signal at the time n.

Figure 3:
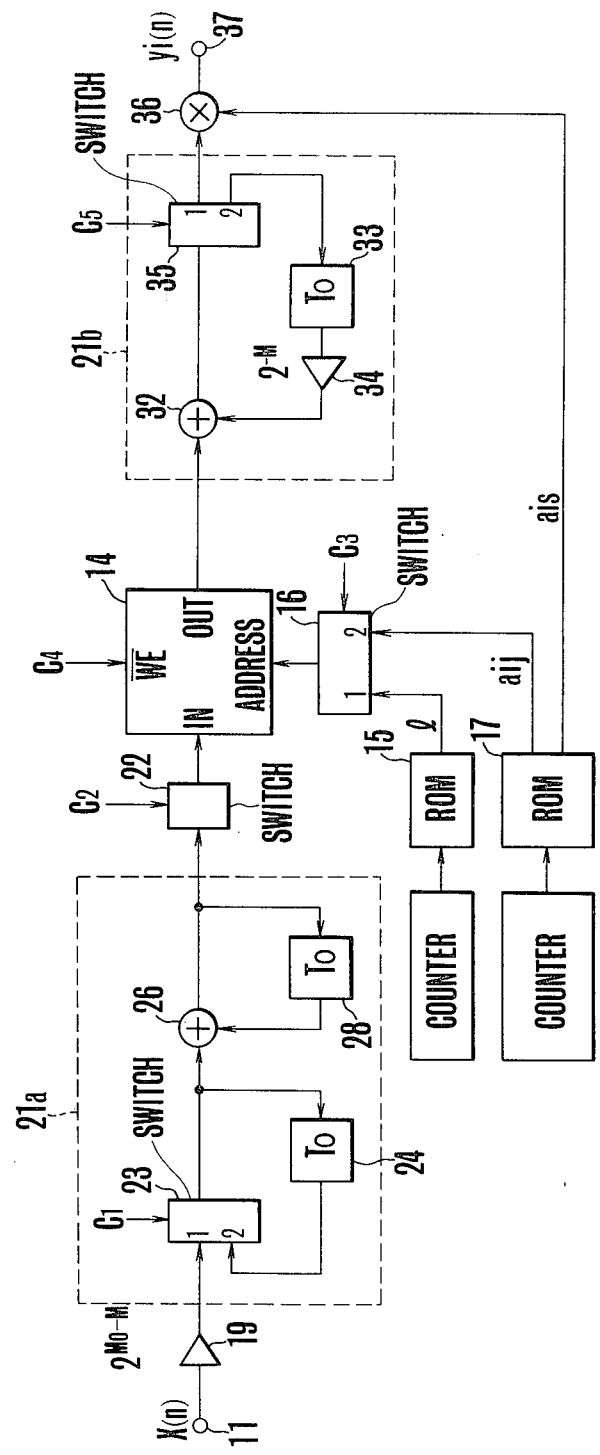
FIG. 3 is a connection diagram showing one example of a weighting circuit utilized in a digital filter embodying the invention.
Figure 5:
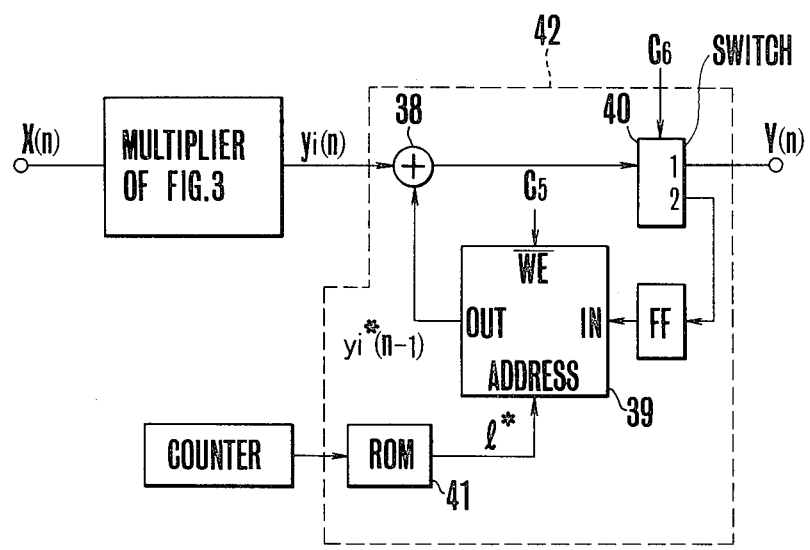
FIG. 5 is a connection diagram showing a circuit construction according to the invention in which the filter shown in FIG. 4 is constructed by utilizing the weighting circuit shown in FIG. 3.

A digital filter arrangement equivalent to that shown in FIG. 4 and having a time division multiplexed construction is formed as shown in FIG. 5 by using the circuit shown in FIG. 3. As has been described hereinabove, it is possible to obtain an output Yi(n) for an input X(n) with the multiplier shown in FIG. 3. In the digital filter shown in FIG. 5, this output is sequentially added to the output $Y_i^*(n-1)$ from a memory device 39 (RAM) by an adder 38 in an addition unit 42. This operation is performed according to the order of i=4, 3, 2, 1, 0 and a data $Y_4(n)+Y_4^*(n-1)$ is outputted through a switch 40 as the output Y(n) of the filter. The switch 40 is thrown to contact 1 when C6="1" but to contact 2 when C6="0". The next output $Y_3(n)+Y_3^*(n-1)$ is stored in an address l*=4 of the memory device 39 as data $Y_4^*(n)$ by being addressed by an address l* from a memory device (ROM) 41. Under these conditions, the switch 40 is thrown to contact 2. This operation is performed for i=3 to 0, provided that $Y_0^*(n-1)=$"0". The above described operation corresponds to the operation over one cycle between inputting of X(n) and outputting of Y(n) with the circuit shown in FIG. 4.

Counters connected to the memories 15, 17 and 41 serve to apply an address signal to these memories. A flip-flop circuit in FIG. 5 is adapted to delay the operation of the memory 39 between reading of the present data and writing of the preceding data. Also, it will be appreciated that in FIG. 6 the time chart is illustrated for the case in which the data $a_{ij}$ is divided into two partial bits each having 3 bits. Accordingly, l is shown for M=3 and $a_{ij}$ is shown for K=2. Further, it will be seen from FIG. 6 that $Y_4(n)$ is derived from $a_{42}$ and $a_{41}$ and $Y_3(n)$ from $a_{32}$ and $a_{31}$, and that $Y_3(n)+Y_3^*(n-1)$ is read at l*=3 and input into the memory 39 at l*=4. This delay is produced by the flip-flop circuit. Furthermore, the overall sequence is timed with clock CLK in FIG. 6 and the delay time $T_0$ corresponds to the period of the clock.

What is claimed is:

1. A digital filter in which the relation between an input data x(n) and an output data Y(n) is:

$$Y(n) = \sum_{i=0}^{N-1} a_{n-i} x(n-i),$$

where n is an integer and $a_{n-i}$ is a multiplier, said filter comprising first means for multiplying the input data x(n) by all the integers l ranging from 0 to $2^M-1$, where M is the bit number of either a binary coded weight data $a_i$ or its partial bit $a_{ij}$ (j=1, 2, ..., K); a first storage for storing an output lx(n) of the first means in an address of l; a selector circuit for selecting the integer l or either the weight data $a_i$ or its partial bit $a_{ij}$ and supplying the selection result to the first storage as an address signal; second means for reading outputs from the first storage by an address signal of the weight data $a_i$ or its K partial bits $a_{ij}$ in the sequence i=N-1, N-2, ..., 0, accumulating and thereafter shifting the outputs to the lower order by the bit number of the address signal, and multiplying the resulting outputs by the sign of $a_i$ to produce $a_i x(n)$; third means including a second storage for reading a data stored in an address corresponding to i, adding the read data and the output $a_i x(n)$, (i=N-2, N-3, ..., 0) of the second means and storing the sum in an address corresponding to i+1; and fourth means for adding an output $a_{N-1} x(n)$ corresponding to i=N-1 of the second means and a data stored in an address corresponding to N-1 of the second storage to produce a filter output.

2. The invention of claim 1 wherein said first means comprises means for accumulating the input data x(n) sequentially in accordance with the following equation:

$$lx(n)=(l-1)x(n)+x(n), \quad 1 \leq l \leq 2^M-1$$

to produce the entire lx(n), (l=0, 1, ..., $2^M-1$).

* * * * *